United States Patent
Huang et al.

(10) Patent No.: US 6,978,411 B2
(45) Date of Patent: Dec. 20, 2005

(54) MEMORY TEST SYSTEM FOR PEAK POWER REDUCTION

(75) Inventors: Cheng-I Huang, Hsinchu (TW); Chen-Teng Fan, Hsinchu (TW); Wang-Jin Chen, Kaohsiung (TW); Jyh-Herny Wang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 444 days.

(21) Appl. No.: 10/265,700

(22) Filed: Oct. 8, 2002

(65) Prior Publication Data

US 2004/0068684 A1 Apr. 8, 2004

(51) Int. Cl.$^7$ ............................................. G01R 31/28
(52) U.S. Cl. .................... 714/733; 714/30; 324/73.1; 377/19
(58) Field of Search ............................. 714/733, 718, 714/30; 365/201; 324/73.1; 377/19

(56) References Cited

U.S. PATENT DOCUMENTS

| | | | | |
|---|---|---|---|---|
| 5,675,545 A | * | 10/1997 | Madhavan et al. | 365/201 |
| 6,343,366 B1 | * | 1/2002 | Okitaka | 714/733 |
| 6,424,583 B1 | * | 7/2002 | Sung et al. | 365/201 |
| 6,587,979 B1 | * | 7/2003 | Kraus et al. | 714/720 |
| 6,643,807 B1 | * | 11/2003 | Heaslip et al. | 714/719 |
| 6,671,842 B1 | * | 12/2003 | Phan et al. | 714/733 |

* cited by examiner

*Primary Examiner*—Albert Decady
*Assistant Examiner*—Esaw Abraham
(74) *Attorney, Agent, or Firm*—Winston Hsu

(57) ABSTRACT

A memory test system for peak power reduction. The memory test system includes a plurality of memories, a plurality of memory built-in self-test circuits and a plurality of delay units. Each of the memory built-in self-test circuits comprises a built-in self-test controller for receiving a clock signal and producing a plurality of required control signals to test one of the memories. Each of the delay units is coupled between two adjacent built-in self-test controllers. The clock signal input to one of the built-in self-test controllers is received by the delay unit to produce a delayed clock signal, and the delay unit outputs the delayed clock signal to the other.

6 Claims, 4 Drawing Sheets

MEMORY TEST SYSTEM FOR PEAK POWER REDUCTION

BACKGROUND OF THE INVENTION

1. Field of the Invention

The present invention relates in general to a memory test system. In particular, the present invention relates to a memory test structure comprising memory built-in self-test circuits to reduce the peak power consumption of tested memories.

2. Description of the Related Art

Memory components must be tested for Wafer Acceptance (WAT). Currently, memories with memory built-in self-test (MBIST) circuits are tested on Automated Test Equipment (ATE), the major advantage of that test efficiency is not determined by test floorplans and test environments. In all kinds of integrated circuits, using the BIST circuit to test memory can reduce the complexity of the test process. With the wide use of BIST circuits, complex test requirements are no longer required. Thus, using BIST circuits to test memory can reduce test costs.

The peak power consumption of multiple concurrent tested memory built-in self-test (MBIST) memories is quiet large. During large peak power consumption, it is easy to misjudge the test result because power supplied by an exterior source is not enough to provide peak power consumption.

SUMMARY OF THE INVENTION

An object of the present invention is to provide a memory test system for peak power reduction to decrease test errors caused by excessive power consumption.

Another object of the present invention is to provide a memory test system comprising memory built-in self-test circuits for reducing test time to decrease test costs.

These objects can be attained by providing a memory test system that includes a plurality of memories that work in a test mode, a plurality of memory built-in self-test circuits, and a plurality of delay units that are connected in series. Each of the built-in self-test circuits comprises a built-in self test controller that produces a plurality of control signals to test one of the memories. A first one of the delay units receives a clock signal that is also supplied to one of the built-in self-test circuits, and each delay unit delays and sends the delayed clock signal to the next delay unit in the series and to one of the built-in self-test controllers.

In the invention, the memory test system for peak power reduction comprises a plurality of memories, a plurality of memory built-in self-test circuits, and a plurality of delay units. The memories work in test mode. Each memory built-in self-test circuit comprises a built-in self-test controller for receiving a clock signal and producing the required control signals to test one of the memories. Each delay unit is coupled between two adjacent built-in self-test controllers. The clock signal input to one of the built-in self-test controllers is received by the delay unit to produce a delayed clock signal, and the delay unit outputs the delayed clock signal to the other.

Each memory built-in self-test circuit further comprises a pattern generator coupled between one of the built-in self-test controllers and one of the memories and a result comparator coupled to the built-in self-test controller. The pattern generator is controlled by the control signal produced by the built-in self-test controller to test the memory. The result comparator is controlled by the control signal produced by the built-in self-test controller to determine the result.

Furthermore, the invention provides another kind of memory test system for peak power reduction. The memory test system comprises a plurality of memories, a memory built-in self-test circuit, and a plurality of delay units. The memories work in test mode. The memory built-in self-test circuit comprises a built-in self-test controller for receiving a clock signal and producing the required control signal to test the memories. Each delay unit is coupled between two adjacent memories. An input signal input to one of the memories is received by the delay unit to produce a delayed input signal, and the delay unit outputs the delayed input signal to the other. The input signal is an address signal for asynchronous RAM or a clock signal for synchronous RAM.

The memory built-in self-test circuit further comprises a pattern generator and a plurality of result comparators. The pattern generator is coupled to the built-in self-test controller and controlled by the control signal produced by the built-in self-test controller to test the memories. Each result comparator is coupled to the built-in self-test controller and controlled by the control signal produced by the built-in self-test controller to determine a test result.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
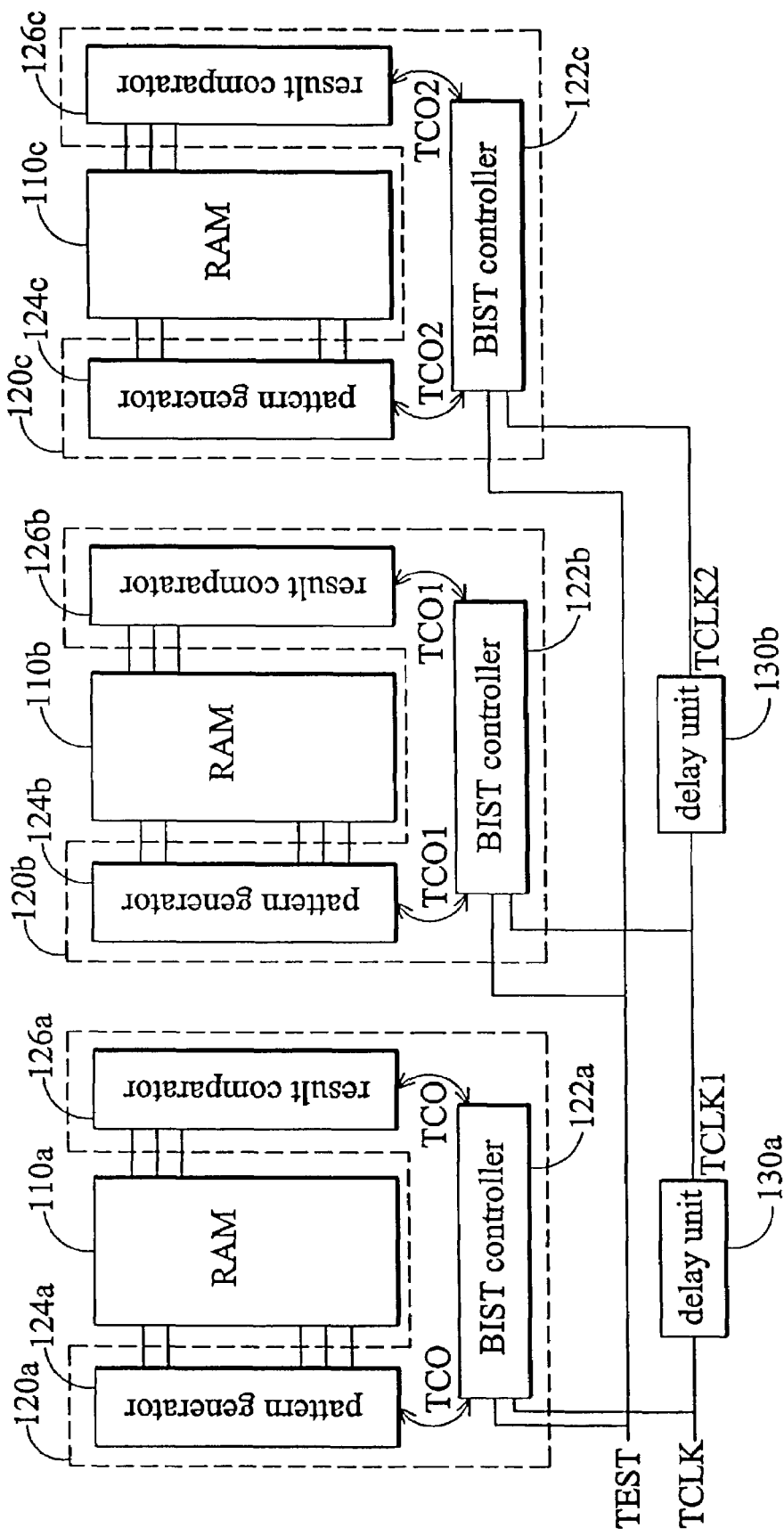
FIG. 1 is a block diagram of a memory test system for peak power reduction according to an embodiment of the invention.

FIG. 1 is a block diagram of a memory test system for peak power reduction according to an embodiment of the invention. In this embodiment, there is an individual memory built-in self-test (MBIST) circuit within a built-in self-test controller in every memory. Thus, the memory test system shown in FIG. 1 can test various kinds of memories. In this embodiment, the memory test system for testing three RAMs with the same size is used as an example. As shown in FIG. 1, the memory test system comprises three random-access memories (RAMs) 110a~110c, three MBIST circuits 120a~120c and two delay units 130a and 130b. A test signal TEST runs the RAMs 110a~110c in test mode. The MBIST circuit 120a comprises a built-in self-test (BIST) controller 122a. A clock signal TLCK is received by the BIST controller 122a. The BIST controller 122a is driven by the clock signal TCLK and produces the required control signals TCO to test the RAM 110a. The MBIST circuit 120b comprises a built-in self-test (BIST) controller 122b. A clock signal TLCK1 is received by the BIST controller 122b. The BIST controller 122b is driven by the clock signal TCLK1 and produces the required control signals TCO1 to test the RAM 110b. The MBIST circuit 120c comprises a built-in self-test (BIST) controller 122c. A clock signal TLCK2 is received by the BIST controller 122c. The BIST controller 122c is driven by the clock signal TLCK2 and produces the required control signals TCO2 to test the RAM 110c. The delay unit 130a is coupled between the BIST controller 122a and the BIST controller 122b. The delay unit 130a receives the clock signal TCLK input to the BIST controller 122a. The delay unit 130a delays the clock signal TCLK to become the clock signal TCLK1 and inputs the clock signal TCLK1 to the BIST controller 122b. The delay unit 130b is coupled between the BIST controller 122b and the BIST controller 122c. The delay unit 130b receives the clock signal TCLK1 input to the BIST controller 122b. The delay unit 130b delays the clock signal TCLK1 to become the clock signal TCLK2 and inputs the clock signal TCLK2 to the BIST controller 122c.

The MBIST circuit 120a also comprises a pattern generator 124a and a result comparator 126a. The pattern generator 124a is coupled between the BIST controller 122a and the RAM 110a. The pattern generator 124a is controlled by the control signals TCO produced by the BIST controller 122a. After receiving the control signals TCO, the pattern generator 124a generates test patterns to test the memory 124a. The result comparator 126a is coupled to the BIST controller 122a. The result comparator 126a is controlled by the control signals TCO produced by the BIST controller 122a. After receiving the control signals TCO, the result comparator 126a determines a result for testing the RAM 110a.

The MBIST circuit 120b also comprises a pattern generator 124b and a result comparator 126b. The pattern generator 124b is coupled between the BIST controller 122b and the RAM 110b. The pattern generator 124b is controlled by the control signals TCO1 produced by the BIST controller 122b. After receiving the control signals TCO1, the pattern generator 124b generates test patterns to test the memory 124b. The result comparator 126b is coupled to the BIST controller 122b. The result comparator 126b is controlled by the control signals TCO1 produced by the BIST controller 122b. After receiving the control signals TCO1, the result comparator 126b determines a result for testing the RAM 110b.

The MBIST circuit 120c also comprises a pattern generator 124c and a result comparator 126c. The pattern generator 124c is coupled between the BIST controller 122c and the RAM 110c. The pattern generator 124c is controlled by the control signals TCO2 produced by the BIST controller 122c. After receiving the control signals TCO2, the pattern generator 124c generates a test pattern to test the memory 124c. The result comparator 126a is coupled to the BIST controller 122c. The result comparator 126c is controlled by the control signals TCO2 produced by the BIST controller 122c. After receiving the control signals TCO2, the result comparator 126c determines a result for testing the RAM 110c.

The following compares the inventive results with those of the prior art.

Figure 2:
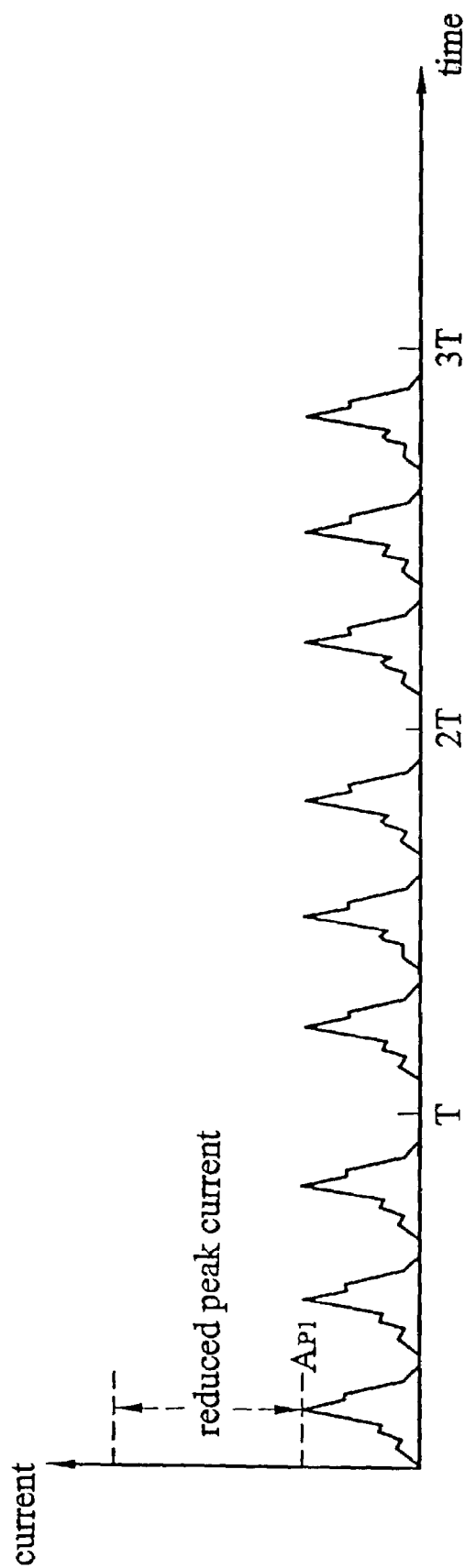
FIG. 2 is a diagram illustrating power consumption when using the memory test system shown in FIG. 1 to test memories.
Figure 3:
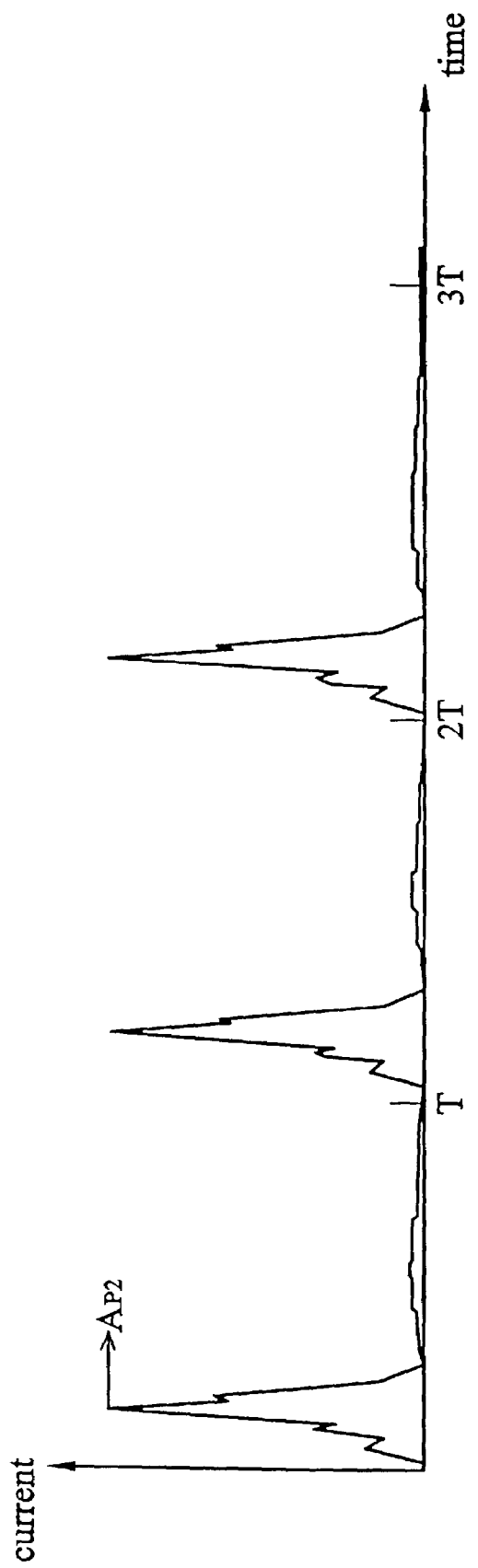
FIG. 3 is a diagram illustrating power consumption when using a conventional memory test system to test the memories shown in FIG. 1.

FIG. 2 is a diagram illustrating power consumption when using the memory test system shown in FIG. 1 to test memories. FIG. 3 is a diagram illustrating power consumption when using a conventional memory test system to test the memories shown in FIG. 1. The vertical axis represents current i.e. power consumption. The cross axis represents the time.

As shown in FIG. 2, the memory test system shown in FIG. 1 completes the test of three RAMs in a period T. As shown in FIG. 3, the conventional memory test system also completes the test of three RAMs in a period T. When using the memory test system shown in FIG. 1 to test RAMs, the driven time for every RAM is separated. Thus, the peak current (i.e. power consumption) $A_{p1}$ shown in FIG. 2 is about one third of the peak current $A_{p2}$ shown in FIG. 3. The reduction of the peak current is obvious so that the probability for misjudging the test result is decreased.

If the MBIST circuit and the RAMs can normally tolerate in the peak current $A_{p2}$, not to misjudge the test result, using the memory test system shown in FIG. 1 will complete the test of nine RAMs the same as the RAMs in FIG. 1 in the period T. In other words, in the memory test system of the invention, the number of tested memories can be increased as needed under only the restriction of the maximum peak current that the memory BIST circuitry can normally tolerate. Thus, the test time is reduced.

Figure 4:
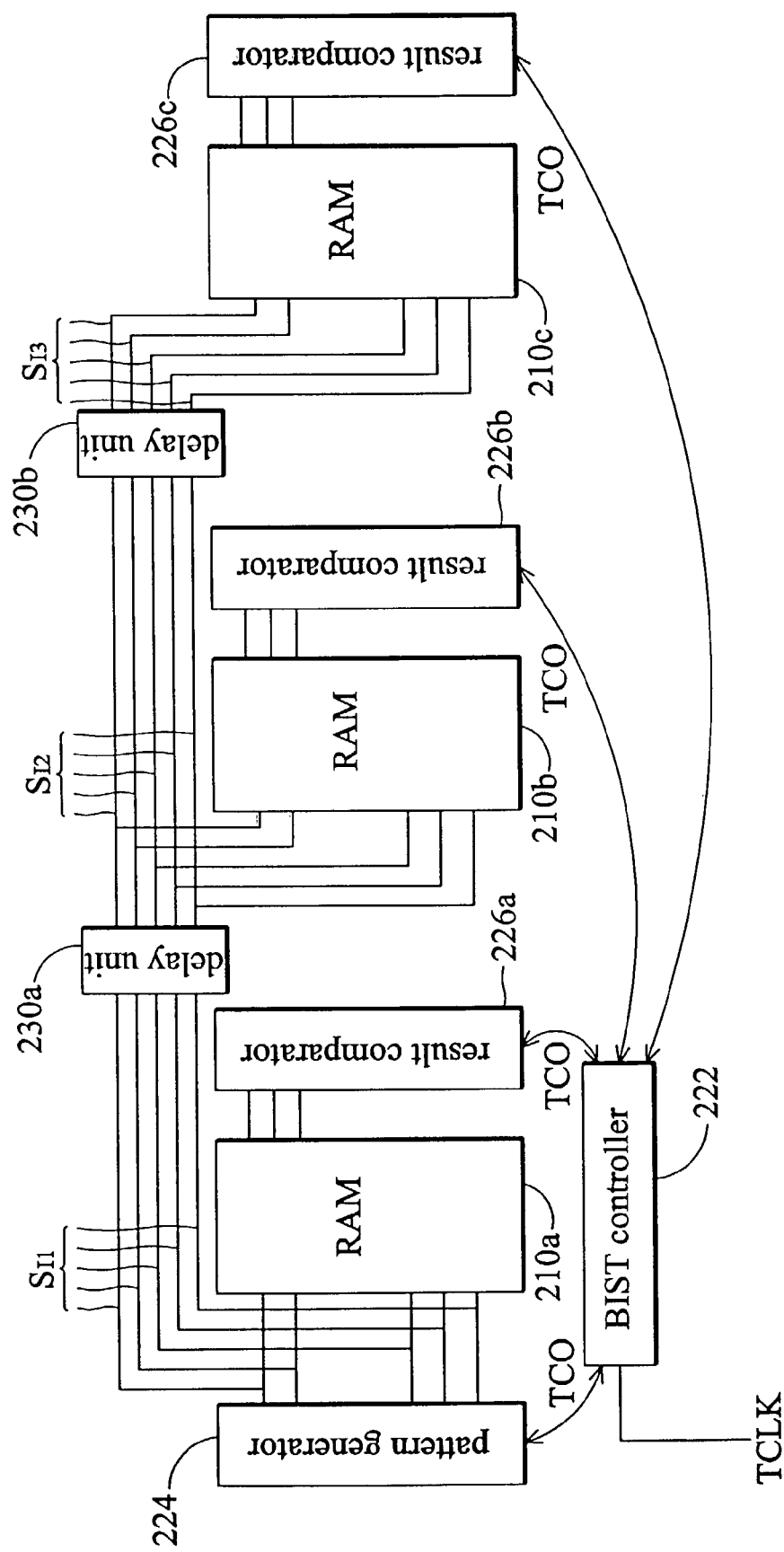
FIG. 4 is a block diagram of a memory test system for peak power reduction according to another embodiment of the invention.

FIG. 4 is a block diagram of a memory test system for peak power reduction according to another embodiment of the invention. In this embodiment, there is only one shared memory built-in self-test (MBIST) circuit within a built-in self-test controller in all memories. Thus, the memory test system shown in FIG. 4 can only test one kind of memory, but the sizes of the memories can be different. In this embodiment, the memory test system for testing three RAM with the same size is used as an example. As shown in FIG. 4, the memory test system comprises three random-access memories (RAMs) 210a~210c, one built-in self-test (BIST) controller 222, one pattern generator 224, three result comparators 226a~226c, and two delay units 230a~230b. A test signal TEST runs the RAMs 210a~210c in test mode. A clock signal TLCK is received by the BIST controller 222. The BIST controller 222 is driven by the clock signal TCLK and produces the required control signal TCO to test the RAMs 210a~210c. The delay unit 230a is coupled between the RAM 210a and the RAM 210b. The delay unit 230a receives an input signal $S_{I1}$ input to the RAM 210a. The delay unit 230a delays the input signal $S_{I1}$ to become an input signal $S_{I2}$ and inputs the input signal $S_{I2}$ to the RAM 210b adjacent to the RAM 210a. The delay unit 230b is coupled between the RAM 210b and the RAM 210c. The delay unit 230b receives the input signal $S_{I2}$ input to the RAM 210b. The delay unit 230b delays the input signal $S_{I2}$ to become an input signal $S_{I3}$ and inputs the input signal $S_{I3}$ to the RAM 210c adjacent to the RAM 210b. The input signals $S_{I1}$~$S_{I3}$ are input signals of the RAMs such as address signal for asynchronous RAM or clock signal for synchronous RAM.

The result comparator 226a is coupled to the BIST controller 222. The result comparator 226a is controlled by the control signal TCO produced by the BIST controller 222 to determine a result for testing the RAM 210a. The result comparator 226b is coupled to the BIST controller 222. The result comparator 226b is controlled by the control signal TCO produced by the BIST controller 222 to determine a result for testing the RAM 210b. The result comparator 226c is coupled to the BIST controller 222. The result comparator 226c is controlled by the control signal TCO produced by the BIST controller 222 to determine a result for testing the RAM 210c.

In the embodiment of the invention, the built-in self-test (BIST) controller 222, the pattern generator 224 and three result comparators 226a~226c compose a memory built-in self-test (MBIST) circuit (not shown in FIG. 4). The memory built-in self-test (MBIST) circuit receives the clock signal TLCK to drive the test of the RAMs 210a~210c, working in test mode. Although the RAMs 210a~210c share the pattern generator 224, the delay units 230a~230b delay signals input to the RAMs 210a~210c. Thus, the driven time for each RAM is separated. The peak current (i.e. power consumption) when using the memory test system shown in FIG. 4, is much smaller than when using a conventional memory test system to test the memories shown in FIG. 4. The reduction of the peak current is obvious so that the probability for misjudging the test result is decreased. Furthermore, in the memory test system of the invention, the number of tested memories can be increased as needed under only the restriction of the maximum peak current that the memory BIST circuitry can normally tolerate. Thus, the test time is reduced.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Thus, the scope of the appended claims should be accorded the broadest interpretation so as to encompass all such modifications and similar arrangements.

What is claimed is:

1. A memory test system for peak power reduction, comprising:
    a plurality of memories working in a test mode;
    a plurality of memory built-in self-test circuits, each comprising a built-in self-test controller producing a plurality of control signals to test one of the memories; and
    a plurality of delay units connected in series, wherein a first one of the delay units receives a clock signal that is also supplied to one of the built-in self test circuits, and each delay unit delays and sends the delayed clock signal to the next delay unit in the series and to one of the built-in self-test controllers.

2. The memory test system as claimed in claim 1, wherein each memory built-in self-test circuit further comprises:
    a pattern generator coupled between one of the built-in self-test controllers and one of the memories, the pattern generator being controlled by the control signals produced by the built-in self-test controller to test the memory; and
    a result comparator coupled to the built-in self-test controller for determining a result for testing the memory.

3. A memory test system for peak power reduction, comprising:
    a plurality of memories working in a test mode;
    a memory built-in self-test circuit comprising a built-in self-test controller for receiving a clock signal and producing at least one control signal to test the memories; and
    a plurality of delay units connected in series, wherein a first one of the delay units receives an input signal, and each delay unit delays and sends the delayed input signal to the next delay unit in the series and to one of the memories.

4. The memory test system as claimed in claim 3, wherein the memory built-in self-test circuit further comprises:
    a pattern generator coupled to the built-in self-test controller, the pattern generator being controlled by the at least one control signal produced by the built-in self-test controller to test the memories; and
    a plurality of result comparators, each coupled to the built-in self-test controller for determining a result for testing one of the memories.

5. The memory test system as claimed in claim 3, wherein the input signal is an address signal for asynchronous RAM.

6. The memory test system as claimed in claim 3, wherein the input signal is a clock signal for synchronous RAM.

* * * * *